(12) United States Patent
Yang et al.

(10) Patent No.: US 9,166,582 B2
(45) Date of Patent: Oct. 20, 2015

(54) CAPACITIVE TOUCH PANEL HAVING FIRST AND SECOND ELECTRODE STRINGS DISPOSED IN DIFFERING DIRECTIONS IN WHICH AT LEAST ONE OF THE ELECTRODE STRINGS COMPRISES DISCONNECTED PORTIONS DISTRIBUTED IN THE SAME DIRECTION

(75) Inventors: Tun-Chun Yang, Hsin-Chu (TW); Seok-Lyul Lee, Hsin-Chu (TW); Chih-Jen Hu, Hsin-Chu (TW); Kuo-Hsing Cheng, Hsin-Chu (TW); Yao-Jen Hsieh, Hsin-Chu (TW); Mei-Sheng Ma, Hsin-Chu (TW); Hsin-Hung Lee, Hsin-Chu (TW); Yuan-Chun Wu, Hsin-Chu (TW); Chun-Huai Li, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 2073 days.

(21) Appl. No.: 12/240,072

(22) Filed: Sep. 29, 2008

(65) Prior Publication Data

US 2009/0085891 A1    Apr. 2, 2009

(30) Foreign Application Priority Data

Sep. 29, 2007    (TW) .............................. 96136531 A

(51) Int. Cl.
   *G06F 3/044*    (2006.01)
   *H03K 17/96*    (2006.01)
(52) U.S. Cl.
   CPC ............ *H03K 17/9622* (2013.01); *G06F 3/044* (2013.01); *Y10T 29/43* (2015.01); *Y10T 29/49105* (2015.01)

(58) Field of Classification Search
   USPC ......................................................... 345/174
   See application file for complete search history.

(56) References Cited

U.S. PATENT DOCUMENTS

| | | | |
|---|---|---|---|
| 4,587,378 A | | 5/1986 | Moore |
| 5,650,597 A | * | 7/1997 | Redmayne ................ 178/18.06 |
| 5,844,506 A | * | 12/1998 | Binstead .......................... 341/34 |
| 6,297,811 B1 | * | 10/2001 | Kent et al. ...................... 345/173 |
| 2004/0251917 A1 | * | 12/2004 | Blanchard ..................... 324/661 |
| 2006/0092142 A1 | | 5/2006 | Gillespie et al. |
| 2006/0097991 A1 | * | 5/2006 | Hotelling et al. ............. 345/173 |
| 2007/0008299 A1 | | 1/2007 | Hristov |
| 2007/0236618 A1 | * | 10/2007 | Maag et al. ...................... 349/12 |
| 2007/0279395 A1 | * | 12/2007 | Philipp et al. ................. 345/173 |
| 2008/0264699 A1 | * | 10/2008 | Chang et al. ................ 178/18.01 |
| 2009/0045823 A1 | * | 2/2009 | Tasher et al. .................. 324/686 |

* cited by examiner

*Primary Examiner* — Grant Sitta
*Assistant Examiner* — Kirk Hermann
(74) *Attorney, Agent, or Firm* — McClure, Qualey & Rodack, LLP

(57) ABSTRACT

A capacitive touch panel and a display device using the capacitive touch panel are provided. The capacitive touch panel includes a first electrode layer, a second electrode layer, and a dielectric layer disposed between two layers. The first electrode layer has a plurality of first A electrode strings and first B electrode strings extended along a first direction. The first A electrode string and the first B electrode string respectively has a plurality of first direction electrodes. The second electrode layer has a plurality of second direction electrodes connected in series along a second direction. The first A and B electrode strings are disconnected in the first electrode layer while they are simultaneously detected for presence of signal variation.

30 Claims, 16 Drawing Sheets

CAPACITIVE TOUCH PANEL HAVING FIRST AND SECOND ELECTRODE STRINGS DISPOSED IN DIFFERING DIRECTIONS IN WHICH AT LEAST ONE OF THE ELECTRODE STRINGS COMPRISES DISCONNECTED PORTIONS DISTRIBUTED IN THE SAME DIRECTION

BACKGROUND OF THE INVENTION

1. Field of the Invention

The present invention relates to a capacitive touch panel and a display device using the capacitive touch panel.

2. Description of the Prior Art

Display panels and flat screen display device using display panels are becoming the mainstream in the field of display devices. For instance, flat television for home use, liquid crystal monitor of the personal computer or of the laptop, display screen of mobile phone and digital camera are products which incorporate the display panel as essential component. As the product design is becoming user-oriented, the usability of the product calls for the touch input function of the display panel which becomes an emphasis in the development of the display device industry.

As FIG. 1a shows, conventional Liquid Crystal Display (LCD) panel of with touch-input function includes a display panel 10 and a touch sensor 30. The touch panel 30 is disposed on the display surface 11 of the display panel 10. The images are displayed through the touch panel 30. The majority of touch panels includes resistive and capacitive touch panels.

As for the resistive touch panel 30, the operation principle includes using the voltage drop to locate the coordinates of the contact point. The touch panel 30 is composed of an upper layer and a lower layer and voltages are applied across two layers in two dimension. When the user physically points at the contact point, a conducting loop is created at the contact point. A voltage drop then occurs at the conducting loop which is then processed by the system. The system can then determine the location of the contact point. However the resistive touch panel 30 cannot accept multi-input simultaneously and also cannot process fingerprint recognition. Furthermore, a minimum applied pressure is required in order to create an effective conducting loop at the contact point, and thus the resistive touch panel 30 is subject to the limit of minimum applied force.

The operation principle of capacitive touch panel 30 is different to that of the resistive touch panel 30. As for the conventional capacitive touch panel shown in FIG. 1b, X direction electrodes 31 and Y direction electrodes 31 are respectively disposed on the upper and a lower layer. A difference in capacitance is created when the user physically points at the touch panel 30 using fingers or other objects. The system will be able to determine the contact point based on the difference in capacitance. As FIG. 1b shows, the electrodes 31 on the same row or column form continuous electrode strings. The electrode strings are arranged in accordance with X direction and Y direction of coordinate system. Excessive amount of electrodes 31 on the same row or the same column may result in excessive resistance or capacitance in the overall system. Furthermore, rows or columns of the electrode strings will be checked separately and thus it will be difficult to reduce the detect time and reaction time of the overall system.

SUMMARY OF THE INVENTION

It is an objective of the present invention to provide a capacitive touch panel with a lower overall system coupling capacitance and resistance.

It is another objective of the present invention to provide a capacitive touch panel with less detection time and reaction time.

It is another objective of the present invention to provide a capacitive touch panel with less system loading.

It is another objective of the present invention to provide a display device which incorporates the capacitive touch panel with less system loading.

The display device of the present invention includes a display panel and a capacitive touch panel. The capacitive touch panel is preferred to be disposed on the display surface of the display panel. The image on the display surface of the display panel is displayed outwards through the capacitive touch panel. When the user physically points at the image on the display surface, the capacitive touch panel will detect the contact point and send a signal to be processed by the back-end processor.

The capacitive touch panel includes a first electrode layer, a second electrode and a dielectric layer. The first electrode layer overlaps the second electrode layer. The dielectric layer is disposed between the first and the second electrode layers to provide signal isolation between the two layers. The first electrode layer includes a first A electrode string and a first B electrode string. The first A electrode string and the first B electrode string are both disposed along a first direction. Each of the first A electrode strings and of the first B electrode strings includes a plurality of first direction electrodes. The second electrode layer includes a plurality of second direction electrodes connected in series and disposed along a second direction.

The first A electrode strings and the first B electrode strings are disconnected in the first electrode layer and thus their signals are not common in the first electrode layer. However, the first A electrode strings and the first B electrode strings are simultaneously checked by the system for presence of signal variation. When signal variations are detected at both the first A electrode strings and the first B electrode strings, the system will regard the signal variations as created by the same cause.

The first A electrode strings and the first B electrode strings can be disposed along the same line or in parallel within the first electrode layer. When the first A electrode string and the first B electrode string are disposed on the same row along the first direction; the detected signal variation on the first A electrode string and on the first B electrode string shows that the contact point is situated on the row where the first A electrode string and the first B electrode string are disposed. The length and amount of first direction electrodes of the first A electrode strings and that of the first B electrode are less than the original electrode string before disconnection. The resistance and coupling capacitance of the first A electrode string and that of the first B electrode string is less than that of an electrode string before disconnection and this will reduce the overall system loading.

When the first A electrode string and the first B electrode string are disposed in parallel. The first A electrode strings and the first B electrode strings represent different coordinates along the orthogonal section direction. During detection for signal variation, the first A electrode strings and the first B electrode strings are categorized into the same group and are checked simultaneously for signal variation. The design of detecting for presence of signals variation at different electrode strings simultaneously will reduce the overall detection time required.

The present invention provides a manufacture method of the capacitive touch panel comprising firstly the step A, of forming the first electrode layer which includes the first A electrode strings and the first B electrode strings disposed along the first direction, such that the first A electrode strings. The first A electrode strings and the first B electrode strings will include a plurality of the first direction electrodes and are disconnected in the first electrode layer. Secondly the step B include forming a second electrode layer to overlap the first electrode layer and to include a plurality of second direction electrodes disposed in series and along a second direction. Finally the step C includes simultaneously detecting for presence of signal variation at the first A electrode strings and the first B electrode strings.

BRIEF DESCRIPTION OF THE DRAWINGS

The present invention will hereafter be described with reference to the accompanying drawings, wherein like reference numerals denote like elements, and:

FIG. 6b and FIG. 6c is the top view of a variation embodiment of the capacitive touch panel shown in FIG. 6a;

DETAILED DESCRIPTION OF THE PREFERRED EMBODIMENT

The present invention provides a capacitive touch panel and a display device incorporating the capacitive touch panel. The capacitive touch panel of the present invention includes an external adhesive capacitive touch panel and a capacitive touch panel integrated into a panel of display device. Furthermore, the above-mentioned display device mentioned includes a flat panel display device but is not limited thereto. The display panel is preferred to include a LCD panel, Organic Light Emitting Diode (OLED) display panel or other display panels. Furthermore, the LCD panel includes transmissive LCD panels, reflective LCD panels, transflective LCD panels and other types of LCD panel.

Figure 1A:
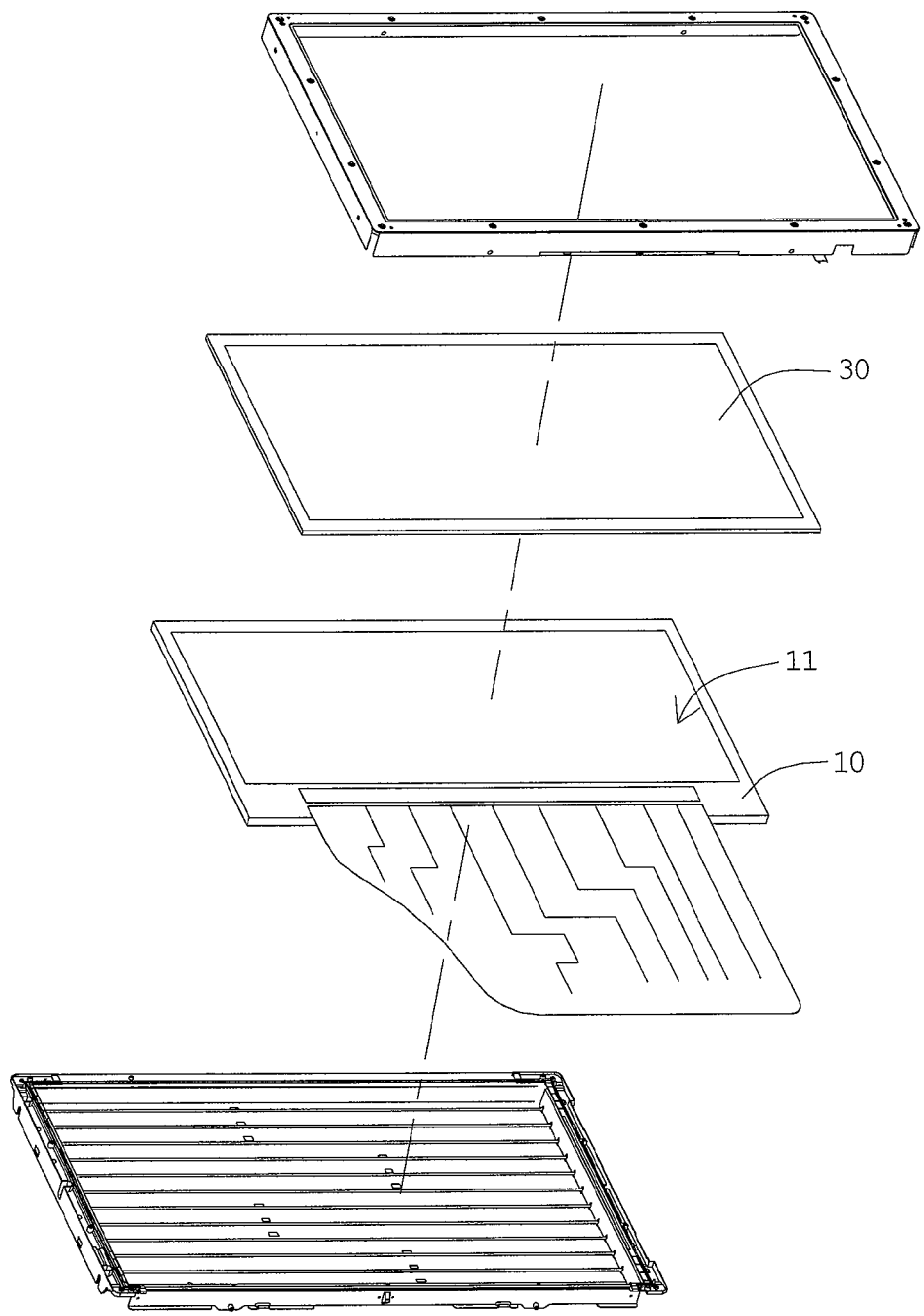
FIG. 1a is the schematic diagram of a display device incorporating conventional touch panel.
Figure 1B:
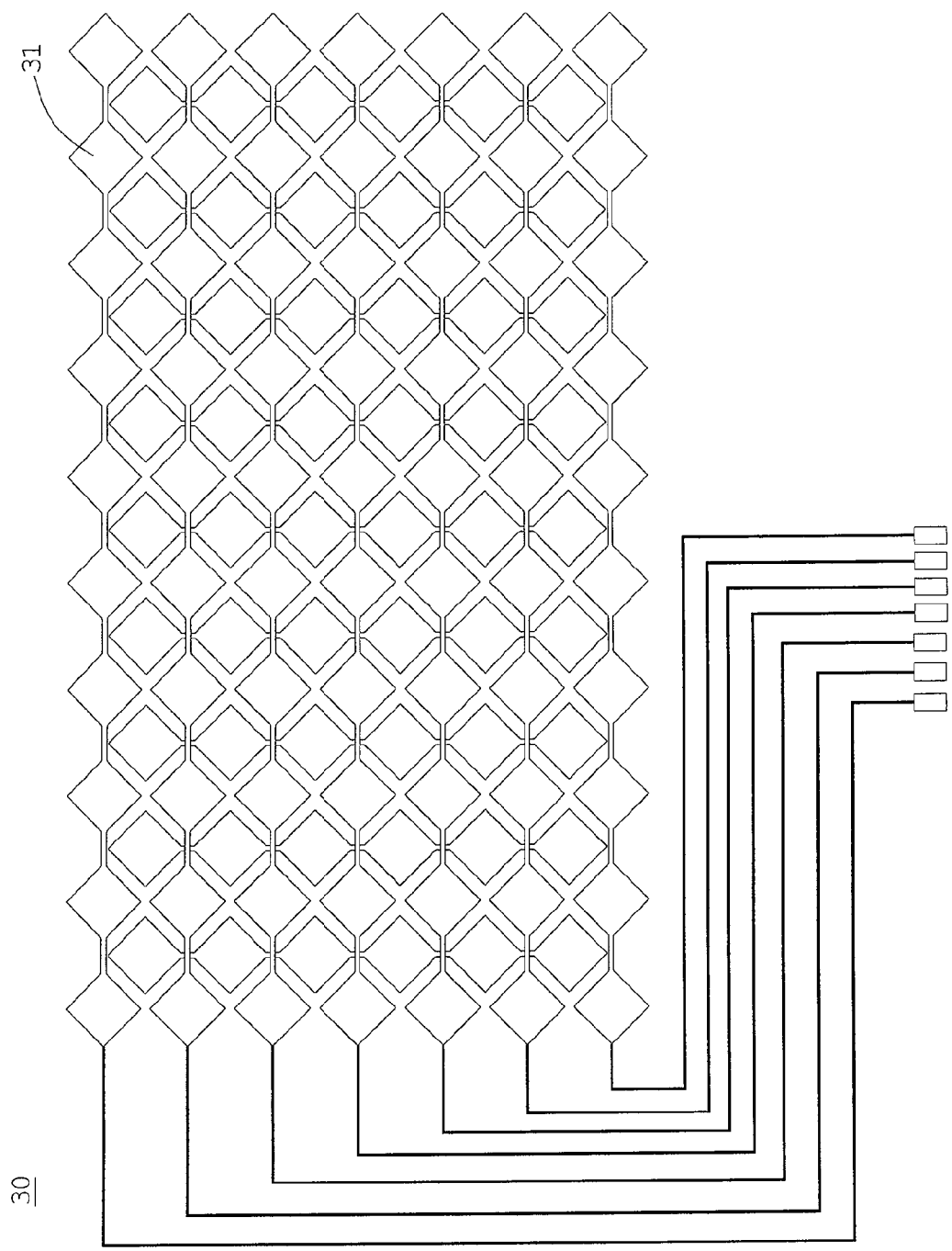
FIG. 1b is the schematic diagram of a conventional capacitive touch panel.
Figure 2:
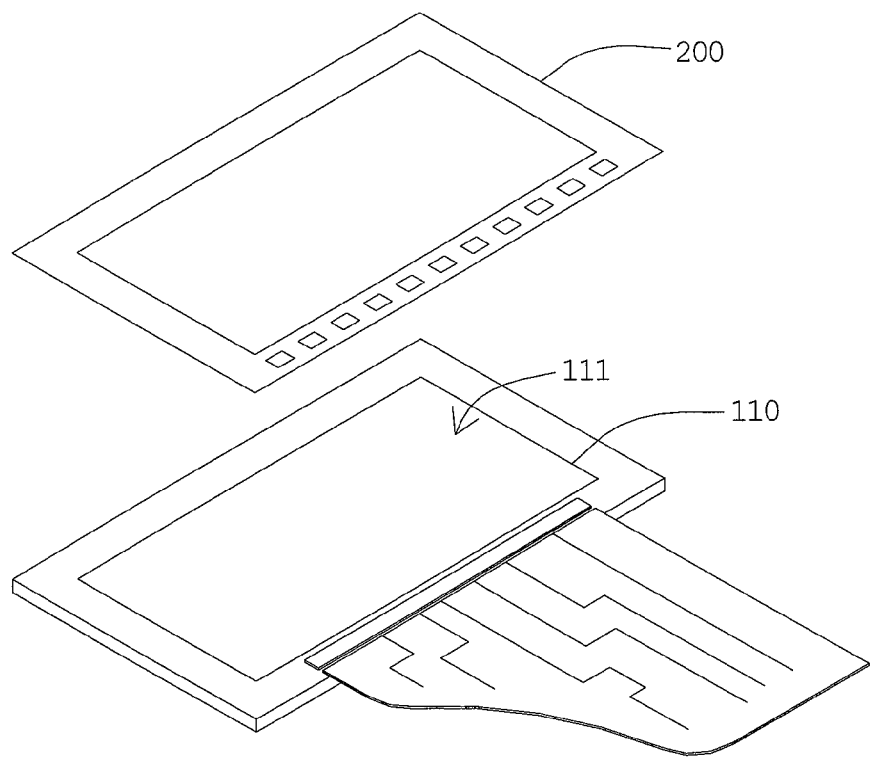
FIG. 2 is the schematic diagram of an embodiment of the display device of the present invention.

In an embodiment shown in FIG. 2, the display device 100 includes a display panel 110 and a capacitive touch panel 200. The capacitive touch panel 200 is preferred to be disposed on a display surface 111 of the display panel 110. The images of display panel 110 on the display surface 111 are displayed outwards through the capacitive touch panel 200. When the user physically points at the images on the display surface 111, the capacitive touch panel 200 will detect the contact point and transmit a signal to be processed by a back-end processor. However, in different embodiment, the capacitive touch panel of the present invention is not limited to the only use in the display device 100; it can also be used with other touch input devices and the touch panel may also be integrated in the LCD panel.

Figure 3:
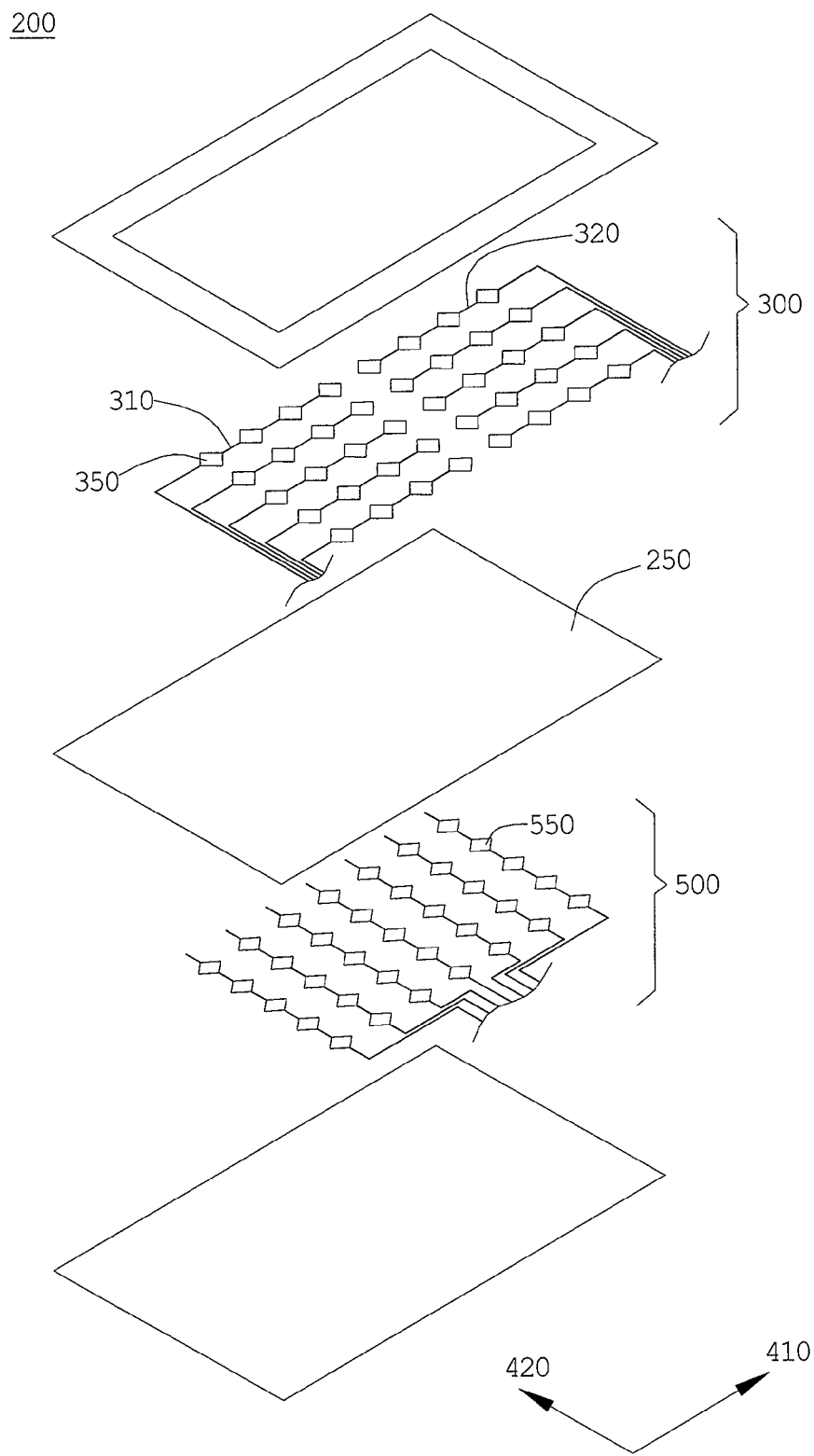
FIG. 3 is the exploded diagram of an embodiment of the capacitive touch panel of the present invention.

As FIG. 3 shows, the capacitive touch panel 200 includes a first electrode layer 300, a second electrode layer 500 and a dielectric layer 250. The first electrode layer 300 is disposed on the second electrode layer 500. The dielectric layer 250 is disposed between the first electrode layer 300 and the second electrode layer 500 to provide the required signal isolation. The first electrode layer 300 includes a plurality of first A electrode strings and first B electrode strings disposed along a first direction 410. Each of the first A electrode strings 310 and first B electrode strings 320 respectively includes a plurality of first direction electrodes 350. As FIG. 3 shows, the second electrode layer 500 includes a plurality of second direction electrodes 550 connected in series along a second direction 420. In the present embodiment, the first direction 410 is preferred to be orthogonal to the second direction 420. However, in different embodiment, the first direction 410 may also cross the second direction 420 in angles other than 90 degree. The signal variation in the first direction electrodes 350 and the second direction electrodes 550 will be detected for determining the position on the capacitive touch panel physically pointed by the user. Furthermore, in different embodiments, when only contact point of a single dimension is required, the second electrode layer 500 can be omitted in the embodiment.

Figure 4A:
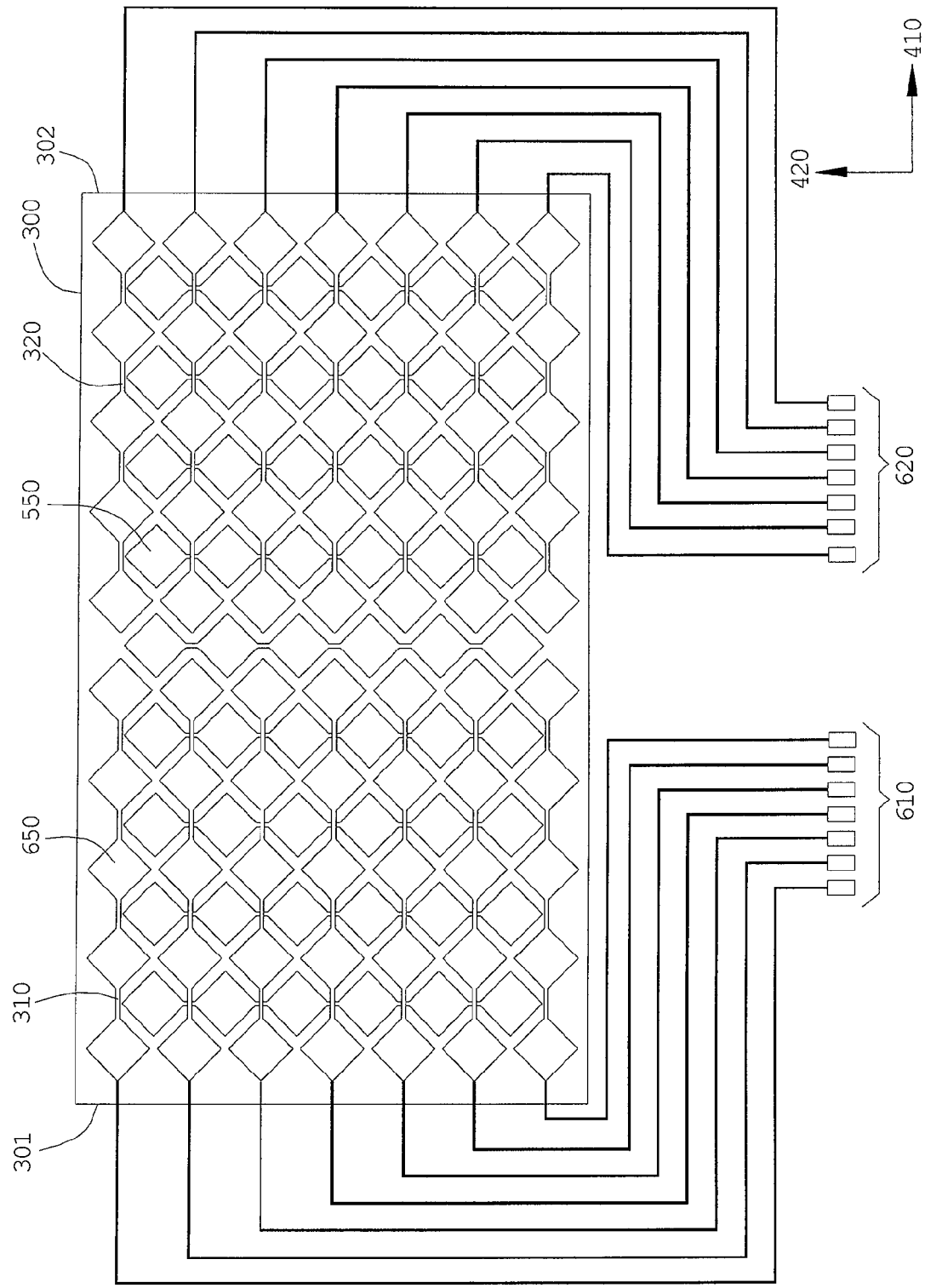
FIG. 4a is the top view of an embodiment of the capacitive touch panel, wherein the first A electrode strings and the first B electrode strings are collinear.

As it can be seen from the top view of FIG. 4a, the first A electrode strings 310 and the first B electrode strings 320 are disposed along the same direction; and interlace with the electrodes strings formed by second direction electrodes 550 to form a grid shape structure. In other words, the first A electrode strings 310 and the first B electrode strings 320 cross the electrode strings formed by second direction electrodes 550, with the dielectric layer 250 disposed in between. As FIG. 4a shows, other than the electrodes distributed on the perimeter of first electrode layer 300, each of the first direction electrodes 350 is disposed between the adjacent second direction electrodes 550. Each of the second direction electrodes 550 is disposed between the adjacent first A electrode strings 310 or/and first B electrode strings 320. In this way, the first direction electrodes 350 and the second direction electrodes 550 are disposed in a faveolate shape on the capacitive touch panel 200. Each of the first direction electrodes 350 is disposed between four second direction electrodes 550 disposed in a shape of the 2×2 matrix. Each of the second direction electrodes 550 is also disposed between four first direction electrodes 350 disposed in a shape of the 2×2 matrix. However, in different embodiments, the first direction electrodes 350 and the second direction electrodes 550 can be distributed in a shape of a matrix, in an orderly pattern or in an irregular pattern.

As FIG. 4a shows, the first A electrode strings 310 and the first B electrode strings 320 are disconnected in the first electrode layer 300. The first A electrode strings 310 and the first B electrode strings 320 will not electrically communicate with each other; and their signals are therefore not common in the first electrode layer 300. However, the first A electrode strings 310 and the first B electrode strings 320 are simultaneously checked by the system for presence of signal variation. In other words, the first A electrode strings 310 and the first B electrode strings 320 are categorised as the same group and are checked simultaneously. Thus signal variations simultaneously detected in the first A electrode strings 310 or in the first B electrode strings 320 will be regarded as created by the same cause.

In an embodiment shown in FIG. 4a, the first A electrode strings 310 and the first B electrode strings 320 are collinear in a first direction 410. In other words, the first A electrode string 310 and the first B electrode string 320 can be regards as made from an electrode string cut into two halves and distributed along a first direction 410. In the present embodiment, the first A electrode strings 310 and the first B electrode strings represent the same Y-coordinate with respect to the orthogonal second direction 420. A detected signal on the first A electrode strings 310 and the first B electrode strings indicate that the location physically pointed by the user is situated on the same row as that of the first A electrode strings 310 and the first B electrode strings. The disconnected electrode string has shorter length and less amount of electrodes; and thus the resistance and coupling capacitance are less than that of the original electrode string before disconnection. The disconnection will reduce the overall loading of the system.

As FIG. 4a shows, the first A electrode strings 310 and the first B electrode strings 320 are connected to the back-end system through the wires extending from the first end 301 and the second end 302 of the first electrode layer 300. In the present embodiment, the capacitive touch panel 200 includes a first linking pad 610 and a second linking pad 620 disposed outside of the first electrode layer 300 respectively. The first A electrode strings 310 and the first B electrode strings 320 couple with the first linking pads 610 and the second linking pads 620 respectively. The system will be able to detect the signal variations on the first A electrode strings 310 and the first B electrode strings via the first linking pads 610 and the second linking pads 620, and then determines the coordinate on the second direction 420 physically pointed by the user.

Figure 4B:
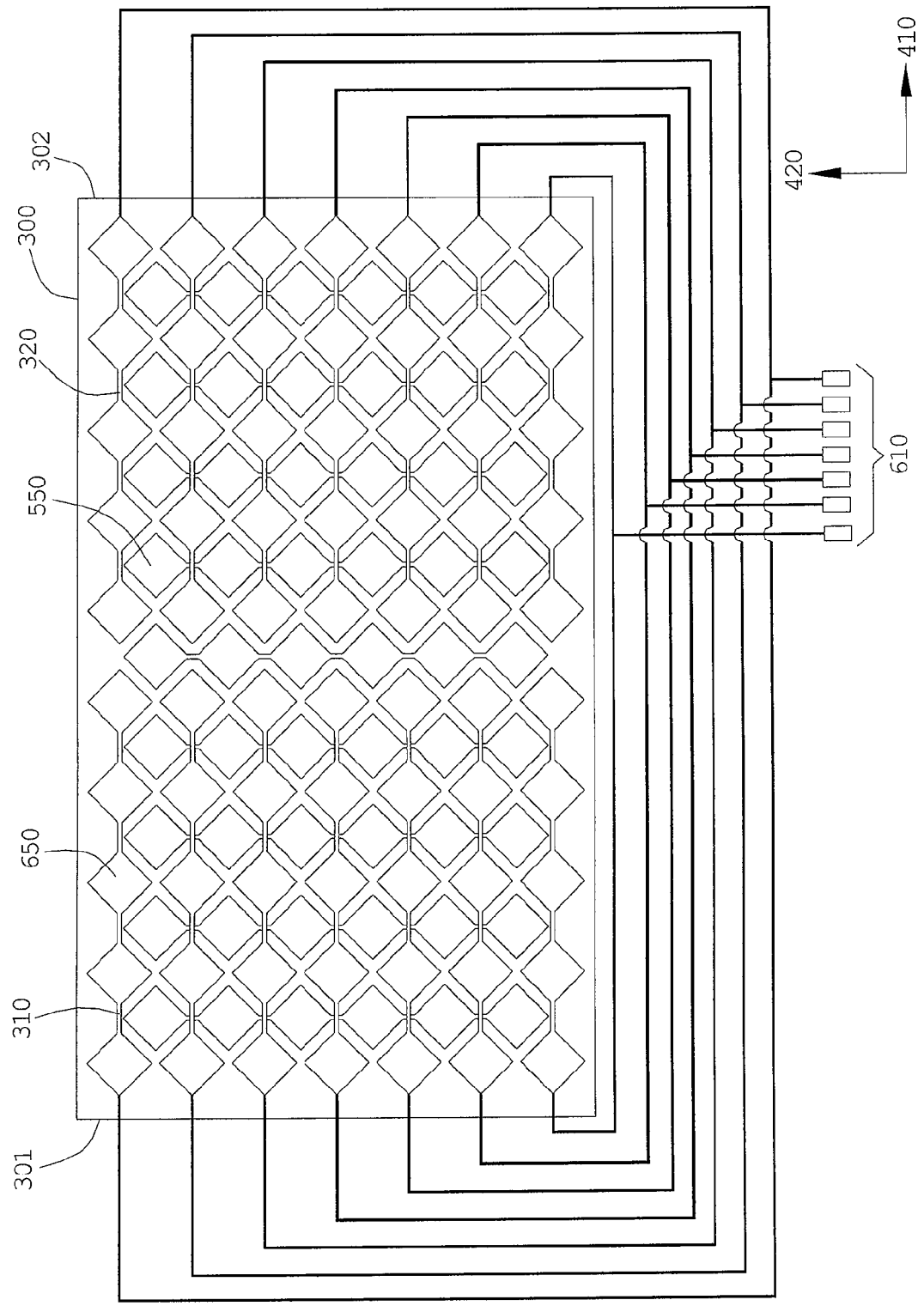
FIG. 4b is the top view of another embodiment of the capacitive touch panel, wherein the first A electrode strings are first coupled together and then coupled with the first linking pads.
Figure 5:
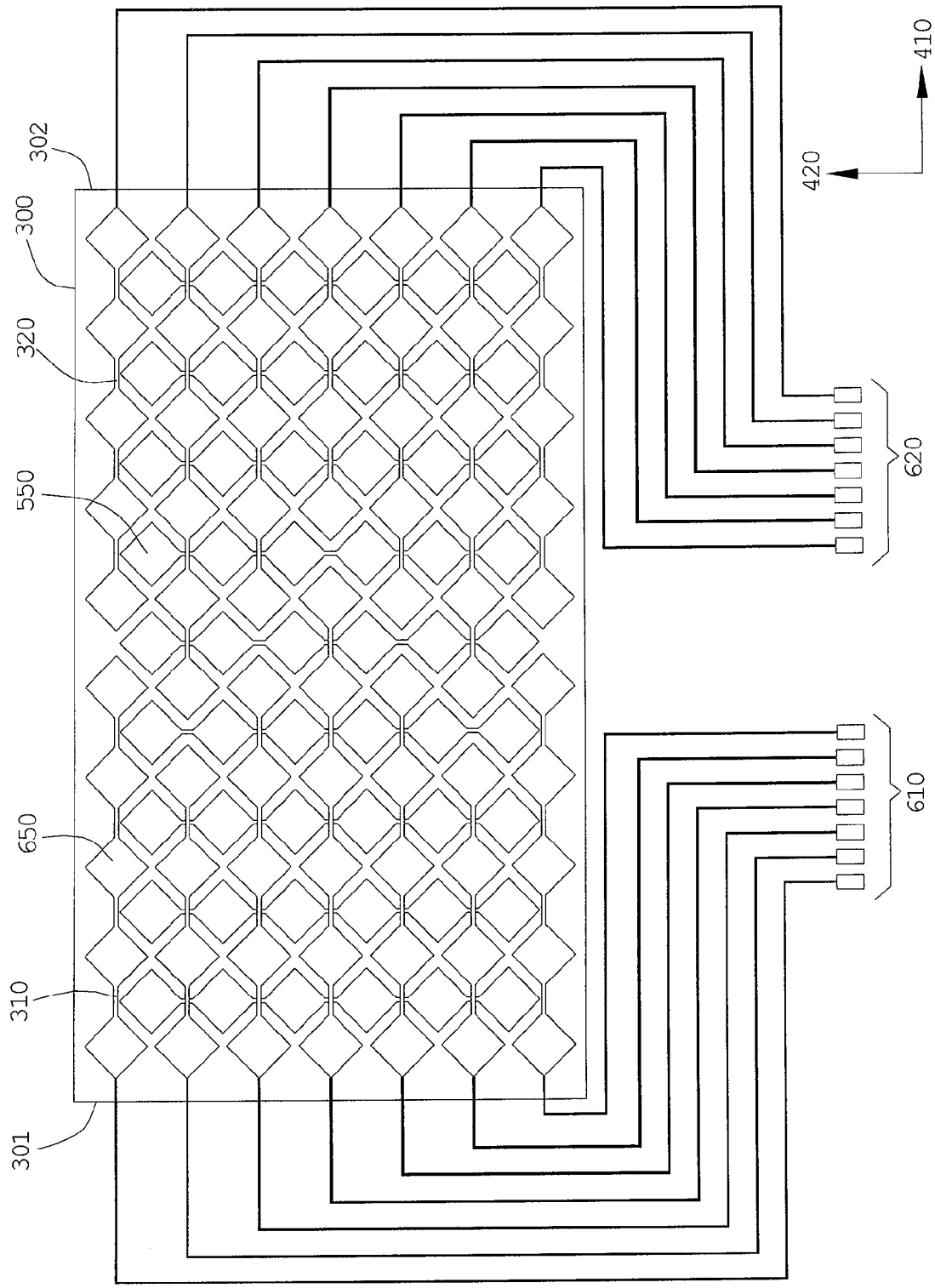
FIG. 5 is the top view of another embodiment of the capacitive touch panel.

In the embodiment illustrated in FIG. 4b, only the first linking pads 610 are disposed outside the first electrode layer 300. The first A electrode strings 310 and the first B electrode strings 320 are coupled together outside the first electrode layer 300 with wires and then coupled with the first linking pads 610. At this time the first A electrode strings 310 and the second B electrode strings 320 are connected in parallel, wherein the back-end system uses only one first linking pad 610 to detect signals on both the first A electrode string 310 and the first B electrode string 320 in order to determine the coordinate on the second direction 420 physically pointed by the user.

Figure 6A:
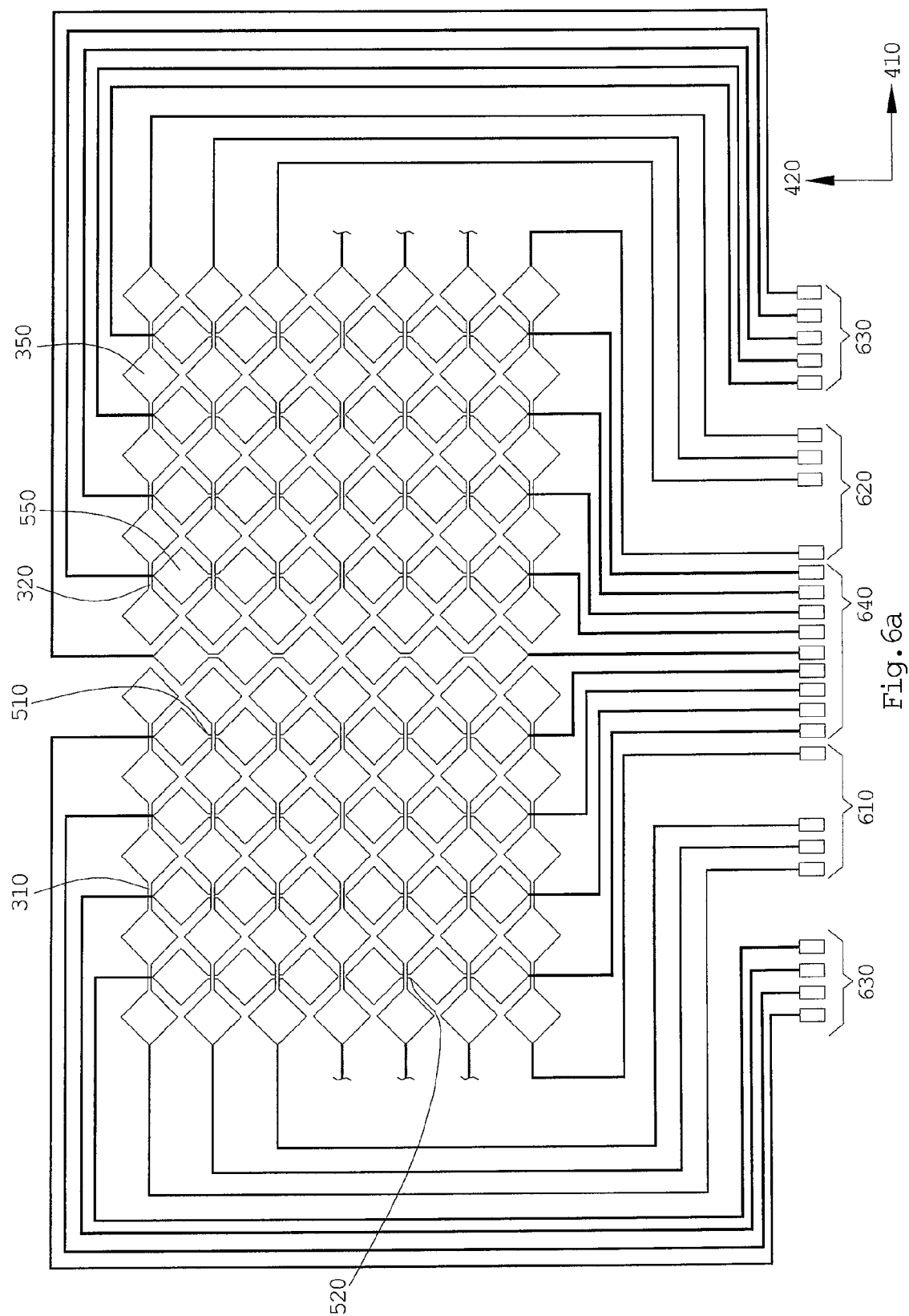
FIG. 6a is the top view of another embodiment of the capacitive touch panel which comprises the second A electrode strings and the second B electrode strings.

In an embodiment shown in FIG. 6a, part of the adjacent second direction electrodes 550 can be connected in series to form second A electrode strings 510 and the adjacent part of the adjacent second direction electrodes 550 can be connected in series to form second B electrode strings 520. The second A electrodes strings 510 and the second B electrode strings 520 are disconnected in the second electrode layer 500. The second A electrode strings 310 and the second B electrode strings 320 will not electrically communicate with each other and their signals are therefore not common in the second electrode layer 300. However, the second A electrode strings 310 and the second B electrode strings 320 are simultaneously detected for presence of signal variation. In other words, the second A electrode strings 310 and the second B electrode strings 320 are classified into the same group and are checked simultaneously. Thus signal variations detected in the first A electrode strings 310 or in the first B electrode strings 320 will be regarded as created by the same cause.

In an embodiment shown in FIG. 6a, the second A electrode strings 510 and the second B electrode strings 520 are collinear along the second direction 420. In other words, the second A electrode strings 510 and the second B electrode string 520 can regarded as a single electrode string cut into two halves and distributed along the second direction 420. In the present embodiment, the second A electrode string 510 and second B electrode string 520 are collinear and therefore have the same Y-coordinate along the first direction 410. A detected signal variation on the second A electrode string 310 and the second B electrode string indicates that the location physically pointed by the user is on the row collinear to the second A electrode string 310 and the second B electrode string. The disconnected second electrode string has shorter length and fewer electrodes; and thus has less resistance and coupling capacitance than that of the original electrode string before disconnection. This design reduces the overall loading of the system.

As FIG. 6a shows, the second A electrode strings 510 and the second B electrode strings 520 couple with the back-end system via conducting wires extended from upper and lower ends of the second electrode layer 500. In the present embodiment, the capacitive touch panel includes a plurality of third linking pads 630 and fourth linking pads 640. The system can detect signal variations on the second A electrode strings 510 and the second B electrode strings 520 via the third linking pads 630 and the fourth linking pads 640; and then determines the coordinate of the location physically pointed by the user.

Figure 6B:
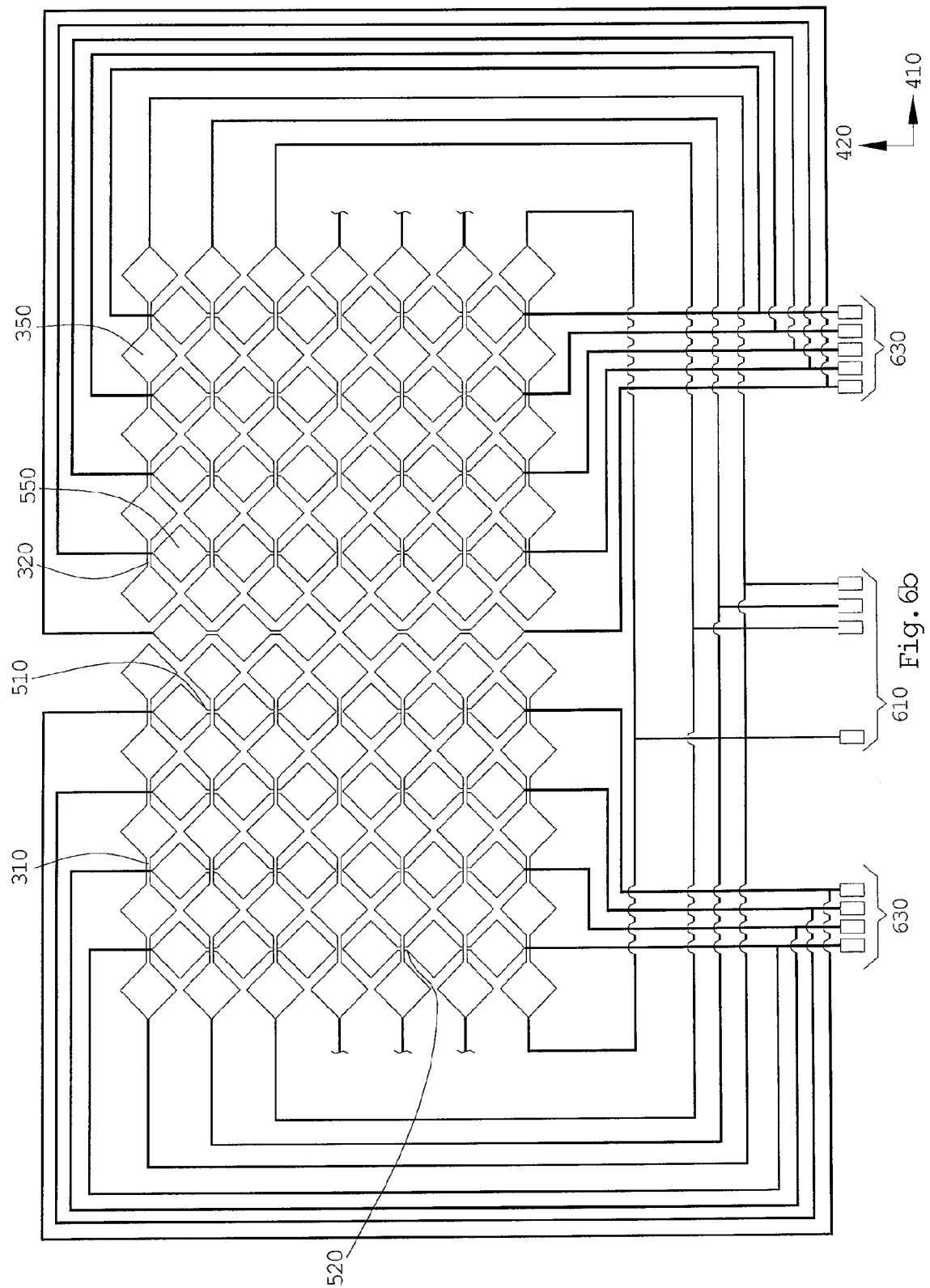

In an embodiment shown in FIG. 6b, only the third linking pads 630 are disposed outside of the third electrode layer 500. The second A electrode strings 510 and the second B electrode strings 520 are coupled together with conducting wires and then coupled to the third linking pads 630. In this way the second A electrode strings 510 and the second B electrode strings 520 are disposed in parallel. The system can detect signals on the second A electrode string 510 and the second B electrode string 520 via a single third linking pad 630; and then determine the coordinate of the pointed location by the user.

Figure 6C:
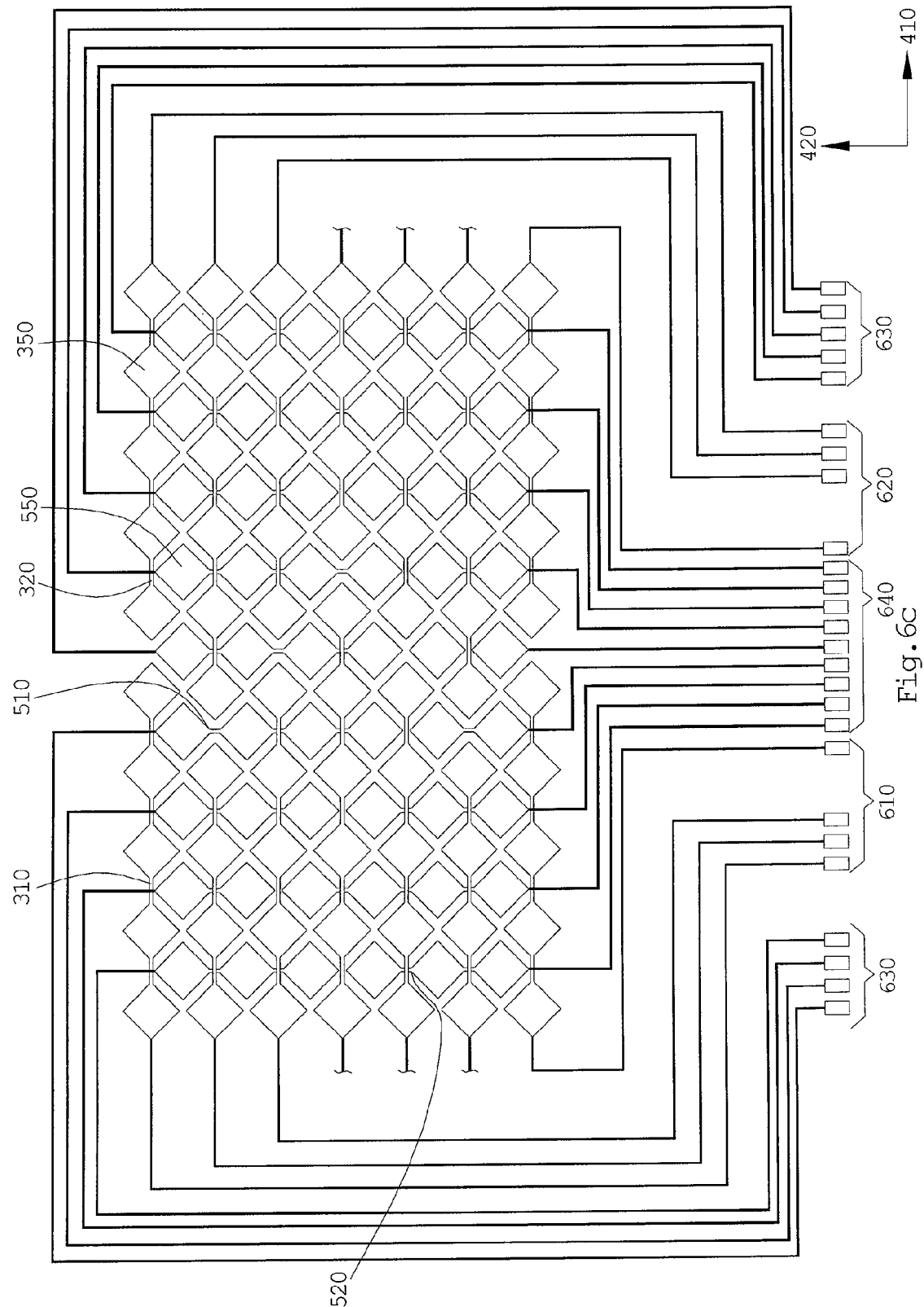

In the embodiment shown in FIG. 6a and FIG. 6b, the second electrode layer 500 includes a plurality of second A electrode strings 510 in parallel. The second electrode layer 500 also includes a plurality of second B electrode strings 520 collinear with the second A electrode strings 510. Each of the second A electrode strings 510 has the same length and the same amount of second direction electrodes 550 connected in series. Each of the second B electrode string 520 has the same length and the same amount of second direction electrodes 550 connected in series. However, in the embodiment shown in FIG. 6c, part of the adjacent second A electrode strings 510 disposed in parallel have different length and different amount of second direction electrodes 550 connected in series. Similarly, the corresponding second B electrode strings 520 have length and amount of second direction electrodes 550 which complement that of the second A electrode strings 510, and thus the second B electrode string 520 and the adjacent second B electrode strings 520 have different length and amount of electrodes. As FIG. 6c shows, in the present embodiment, space between second A electrode strings 510 and the corresponding second B electrode strings 520 has a distribution shape selected from a group of an indented shape, an oblique line shape and a trapezium shape, and not the linear shape shown in FIG. 6a and FIG. 6b. This design will average the lightness variation due to the space distribution between the second A electrode strings 510 and the corresponding second B electrode strings 520. This design will also make the space between the second A electrode strings 510 and the second B electrode strings 520 less visible.

Figure 7:
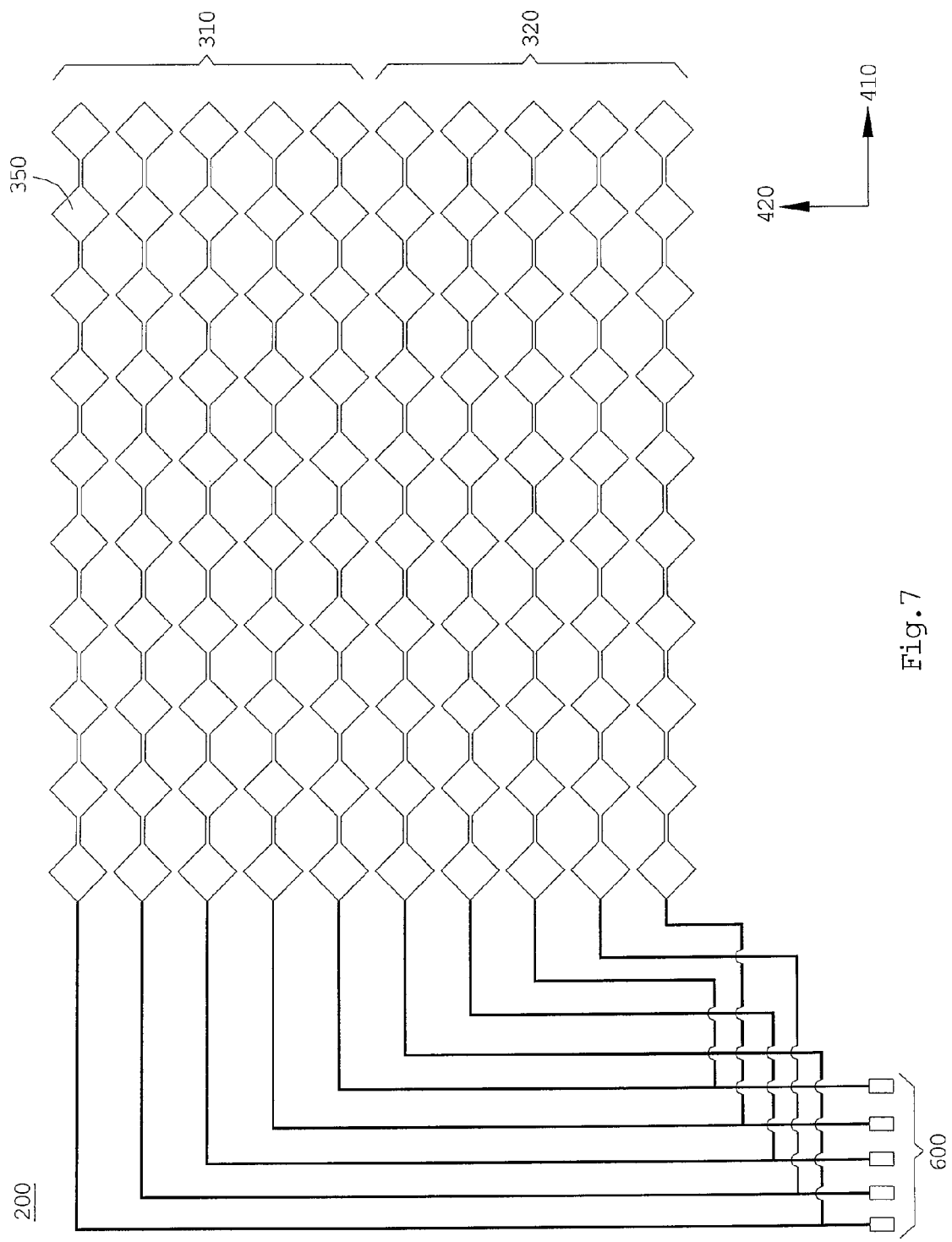
FIG. 7 is the top view of another embodiment of the capacitive touch panel, wherein the first A electrode strings and the first B electrode strings are parallel.

In an embodiment shown in FIG. 7, the first A electrode strings 310 and the first B electrode strings 320 are disposed in parallel and are not collinear in the first electrode layer 300. The first A electrode strings 310 and the first B electrode strings 320 do not have the same Y-coordinate along the second direction 420. The first A electrode strings 310 and the first B electrode strings 320 are not electrically coupled in the first electrode layer 300, but all of these electrode strings are simultaneously detected for presence of signal variation. In other words, the first A electrode strings 310 and the first B electrode strings 320 will be regarded as being in the same group and checked simultaneously. This design will check different electrode strings simultaneously in order to saves the overall detection time.

As FIG. 7 shows, in a more preferred embodiment, the first A electrode string 310 and the first B electrode string 320 disposed in parallel couple with each other outside of the first electrode layer 300, then couple with the linking pads 600, and afterwards couple with the back-end system. Furthermore, the present embodiment includes a plurality of first A electrode strings 310 and first B electrode strings 320, wherein the first B electrode strings 320 corresponding to the adjacent first A electrode strings 310 are not adjacent to each other. In other words, if the first A electrode string 310 and the B electrode string 320 are paired, then the pair will have at most one electrode string adjacent to other pairs of electrode strings. The electrode string adjacent to other pairs may be a first A electrode string 310 or a first B electrode string 320.

When the user physically points at the capacitive touch panel 200, the user normally points at the two electrode strings adjacent to each other. One first A electrode string couples with one first B electrode string and thus a detected signal cannot indicate if the detected signal originates from signal the first A electrode string 310 or the first B electrode string 320. If signal variations are detected at two adjacent first A electrode strings 310 which are coupled with B electrode strings 320 not adjacent to each other. The system will be able to determine that the contact point falls on the location where the two adjacent A electrode strings 310 pass through.

Figure 8A:
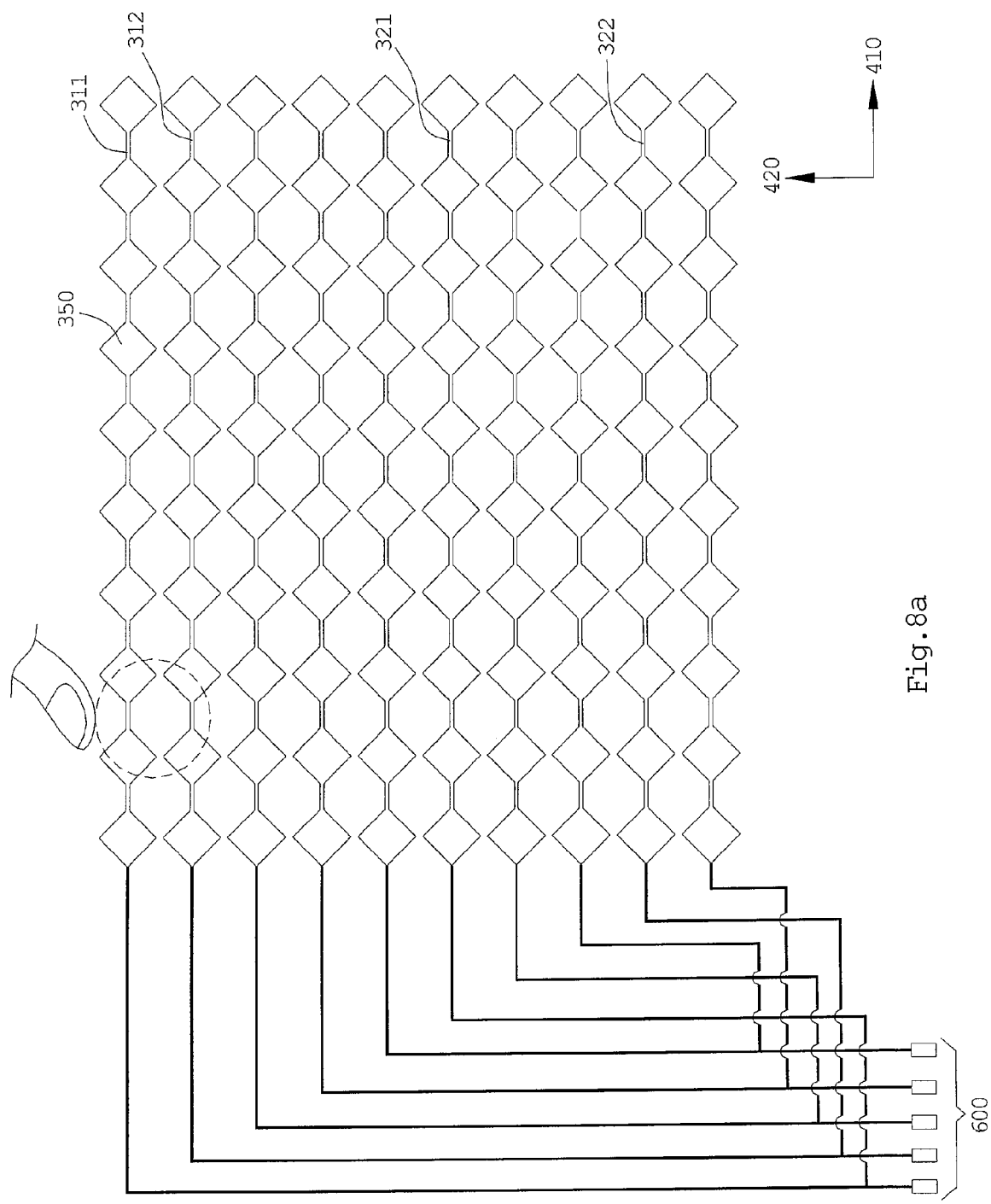
FIG. 8a is the operation schematic diagram of the embodiment shown in FIG. 7.
Figure 8B:
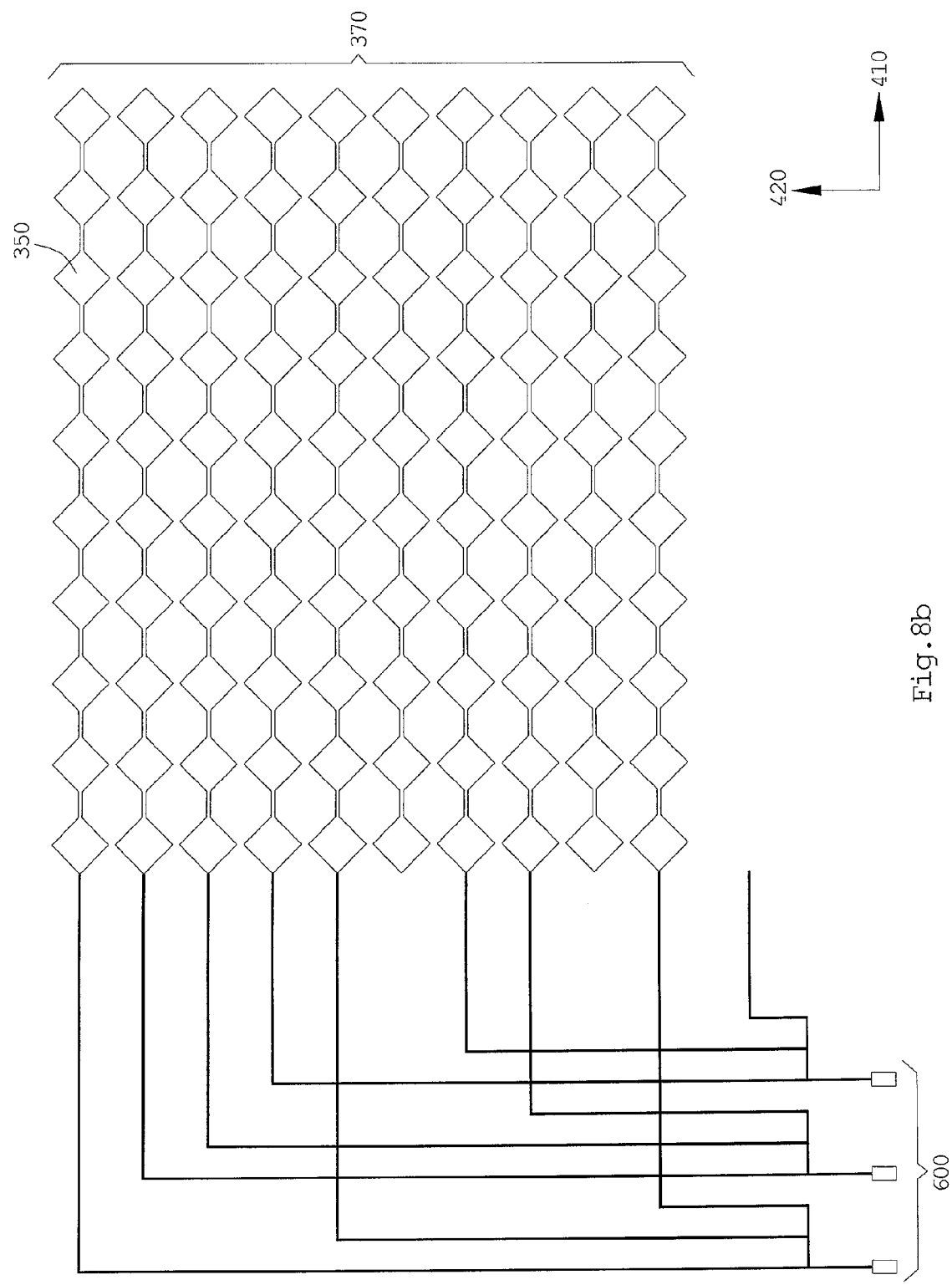
FIG. 8b is a variation of the embodiment shown in FIG. 7.

In the embodiment shown in FIG. 8, when the user physically points at the first electrode string 311; the system will detect signal variation from the first A electrode string 311 and from the first B electrode strings 321. The contact point by the user covers both the first A electrode string 311 and the adjacent first A electrode string 312, and thus the system will simultaneously detect signal variations at the first A electrode string 312 and the first B electrode strings 322. The first A electrode string 311 is adjacent to the first electrode string 312 and thus the system will be able to determine the contact point by the user. Furthermore, in the embodiment shown in FIG. 8b, three electrode strings 370 can be coupled to form a single group. Each group of electrode strings 370 will have at most one electrode string 370 adjacent to other group and this design will facilitate the determination of contact point by the user.

It should be indicated that the embodiments shown in FIG. 7, FIG. 8a and FIG. 8b are applied to the first electrode layer 300. However, in other embodiments, the design of using parallel electrode strings 370 can also be applied to the first direction electrodes 350 in the first electrode layer 300 and the second direction electrodes 550 in the second electrode layer 500. Furthermore, the embodiment shown in FIG. 7 may incorporate the design of collinear electrode string shown in FIG. 6a, 6b and 6c and make the second direction electrodes 550 in the second electrode layer 500 into collinear electrode strings.

Figure 9:
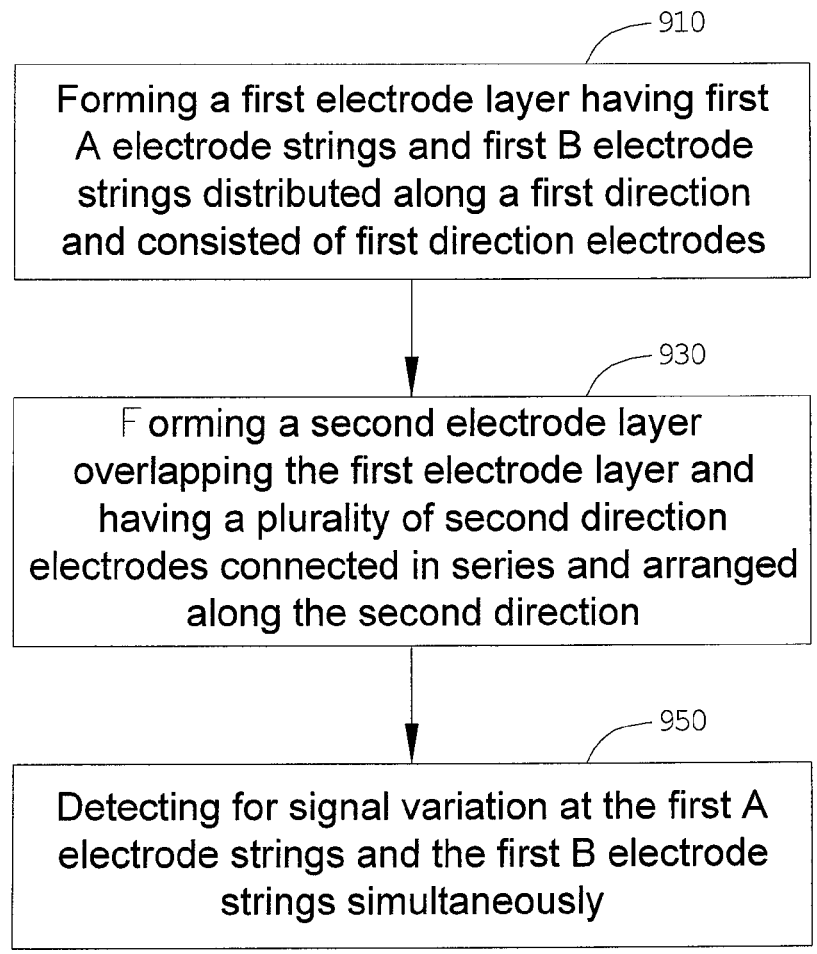
FIG. 9 is the flow chart of a manufacture method of the capacitive touch panel.

The present invention provides a method of manufacturing the capacitive electrode touch panel. As FIG. 9 shows, the step 910 includes forming a first electrode layer having first A electrode strings and first B electrode strings distributed along a first direction. This step also includes disposing a plurality of first direction electrodes on each first A electrode string and each first B electrode strings; and making the first A electrode string and the first B electrode string disconnected from each other in the first electrode layer. The step of forming the first electrode layer includes various semi-conductor processes such as etching, deposition, coating or other processes.

The step 930 includes forming a second electrode layer having a plurality of second direction electrodes connected in series along the second direction. The second electrode layer is disposed on the first electrode layer. The second direction is preferred to be orthogonal to the first direction. However, the second direction may cross the first direction in angles other than 90 degree. The method of forming the second electrode layer includes various semi-conductor processes, such as etching, deposition, coating or other processes. Furthermore, the present step is preferred to form a dielectric layer within the first electrode layer, within the second electrode layer or between the two electrode layers, in order to electrically isolate the first electrodes and the second electrodes.

The step 950 includes detecting for signal variation at the first A electrode strings and the first B electrode strings simultaneously. This step can be executed by using the system to detect for signal variation via the first linking pads and the second linking pads coupled with the first A electrode strings and the first B electrode strings respectively. This step can also be executed by first coupling the first A electrode string and the B electrode string into a pair, and then using the system end to simultaneously detect for signal variation via a single linking pad coupled with the pair of first A electrode string and the first B electrode string.

Figure 10:
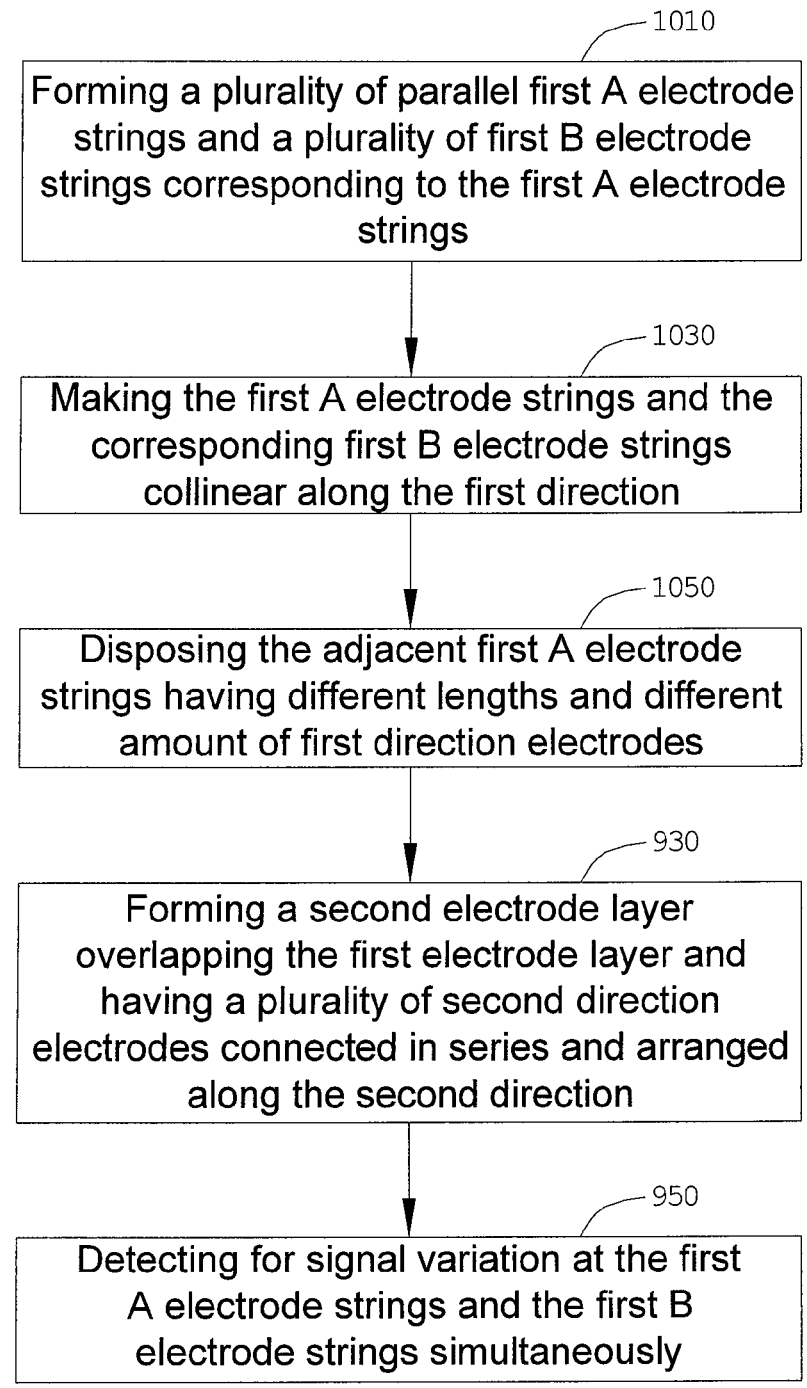
FIG. 10 and FIG. 11 are variation embodiments of the manufacture method shown in FIG. 9.

In an embodiment shown in FIG. 10, the step 910 includes step 1010, step 1030 and step 1050. The step 1010 includes forming a plurality of first A electrode strings disposed in parallel and forming corresponding first B electrode strings. The step 1030 includes making the first A electrode strings and the corresponding first B electrode strings collinear along the first direction. The step 1050 includes disposing the adjacent first A electrode strings having different lengths and different amount of first direction electrodes. In this design, the space between the first A electrode strings and first B electrode strings has a distribution shape selected from a group of an indented shape, an oblique shape and a trapezium shape. This design will average the lightness variation due to the space distribution between the first A electrode strings 510 and the corresponding first B electrode strings 520. This design will also make the space between the second A electrode strings 510 and the second B electrode strings 520 less visible. Furthermore, the length and the amount of first direction electrodes of the first A electrode strings and of the first B electrode strings are less than that of original electrode strings before disconnection. This design will reduce the overall loading of the system.

Figure 11:
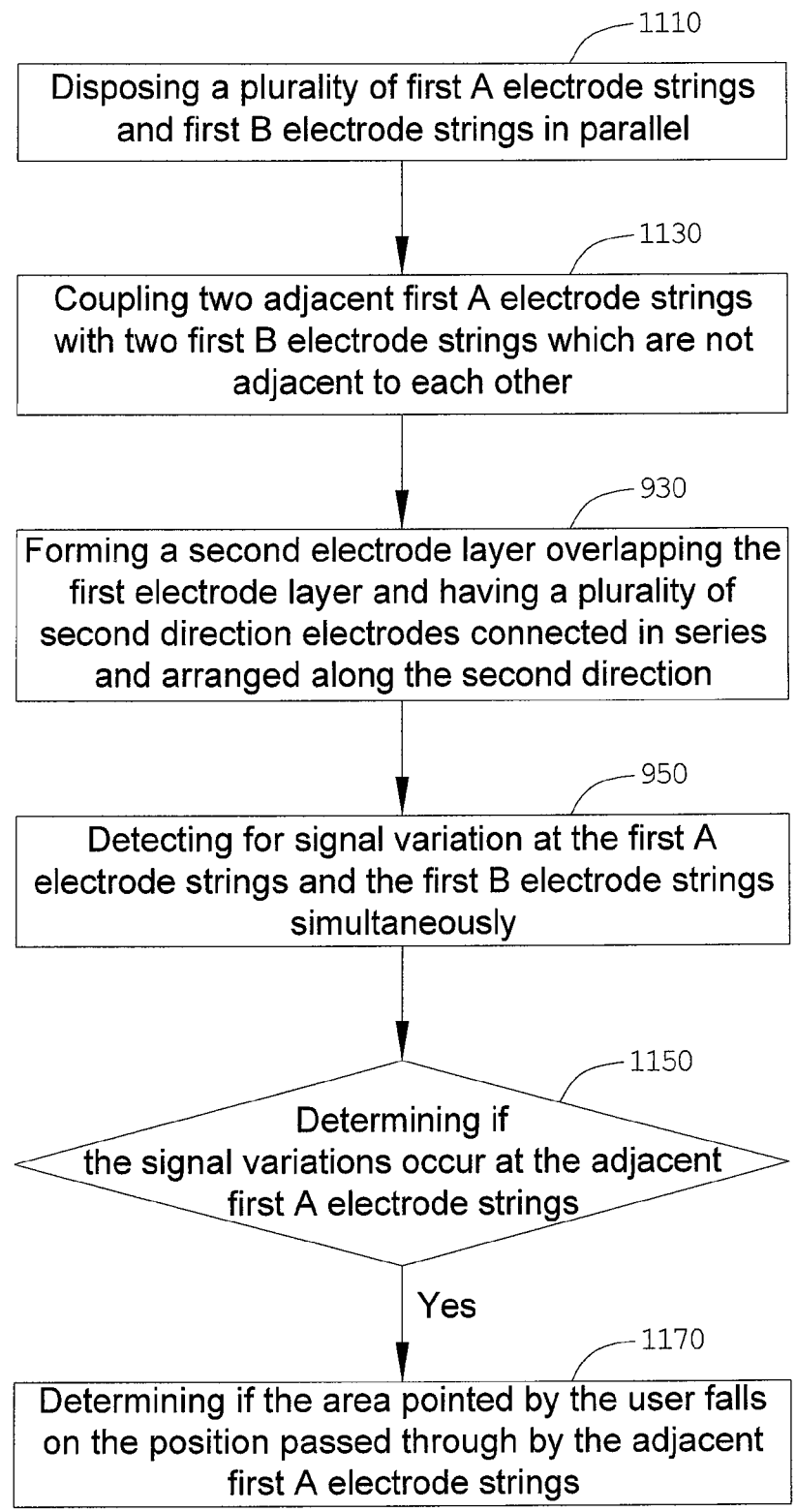

In an embodiment shown in FIG. 11, the step 910 may include step 1110 and step 1130. The step 1110 includes disposing a plurality of first A electrode strings and first B electrode strings in parallel but not collinear. The step 1130 includes coupling two adjacent first A electrode strings with two first B electrode strings which are not adjacent to each other.

When the user physically points at the touch panel; normally two adjacent electrode strings will be pointed simultaneously. The first A electrode string couples with the first B electrode string and thus a signal variation cannot indicate whether which electrode string is contacted. In step 1150, if signal variations are simultaneously detected at the adjacent first A electrode strings; because the two first B electrode strings corresponding to the above-mentioned first A electrode strings are not adjacent to each other. Thus in the step 1170, the system will determine if the signal variations occur at the adjacent first A electrode strings. In other words, the area pointed by the user falls on the position passed through by the adjacent first A electrode strings.

It needs to be emphasized that the second direction electrodes in the second electrode layer can be manufactured by the methods shown in the FIG. 8, FIG. 9 and FIG. 10. The production method and structure of the first direction electrodes and the second direction electrodes can be adjusted to increase the diversity in design in order to satisfy demands from various products.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A capacitive touch panel comprising:
a first electrode layer having a first A electrode string and a first B electrode string distributed along a first direction, each of the first A electrode string and of the first B electrode string having a plurality of first direction electrodes respectively, wherein one first direction electrode of the first A electrode string and one first direction electrode of the first B electrode string distributed in a straight line along the first direction are disconnected in the first electrode layer, the first A electrode string and the first B electrode string are simultaneously detected for presence of signal variation; and
a second electrode layer overlapping the first electrode layer and having a plurality of second direction electrodes connected in series and distributed along a second direction, wherein the second direction crosses the first direction.

2. The capacitive touch panel of claim 1, wherein the first A electrode string and the first B electrode string are collinear along the first direction.

3. The capacitive touch panel of claim 2, wherein the first electrode layer includes a plurality of parallel first A electrode strings in parallel and a plurality of corresponding first B electrode strings, the adjacent first A electrode strings have different amount of the first direction electrodes and thus the space between the first A electrode strings and the first B electrode strings has a distribution shape selected from a group of an indented shape, an oblique line shape and a trapezium shape.

4. The capacitive touch panel of claim 2, wherein the first electrode layer includes a plurality of parallel first A electrode strings and a plurality of corresponding first B electrode strings, the adjacent first A electrode strings have equal number of the first direction electrodes.

5. The capacitive touch panel of claim 2 further comprising a first linking pad and a second linking pad disposed outside of the first electrode layer, wherein a conducting wire is extended from a first end of the first electrode layer to couple the first A electrode string with the first linking pad, a conducting wire is extended from a second end of the first electrode layer to couple the first B electrode together with the second linking pad.

6. The capacitive touch panel of claim 2 further comprising a first linking pad disposed outside of the first electrode layer, wherein the first A electrode string couples with the first B electrode string via a conducting wire disposed outside of the first electrode layer and the conducting wire couples with the first linking pad.

7. The capacitive touch panel of claim 2, wherein a part of the adjacent second direction electrode strings couple in series to form a second A electrode string and another part of the adjacent second direction electrode strings couple in series to form a second B electrode string, wherein the second A electrode string and the second B electrode string are disconnected in the second electrode layer, the first A electrode string and the first B electrode string are simultaneously detected for presence of signal variation.

8. The capacitive touch panel of claim 7, wherein the second electrode layer includes a plurality of parallel second A electrode strings and a plurality of corresponding second B electrode strings, the adjacent second A electrode strings have different number of the first direction electrodes, the space between the second A electrode strings and the second B electrode strings has a distribution shape selected from a group of an indented shape, an oblique line shape and a trapezium shape.

9. The capacitive touch panel of claim 7, wherein the second electrode layer includes a plurality of parallel second A electrode strings and a plurality of corresponding second B electrode strings, the adjacent second A electrode strings have equal number of the second direction electrodes.

10. The capacitive touch panel of claim 7 further comprising a third linking pad and a fourth linking pad disposed outside of the second electrode layer, wherein a conducting wire is extended from a first end of the second electrode layer to couple the second A electrode string with the third linking pad, the second B electrode string couples with the fourth linking pad via a conducting wire extended from a second end of the second electrode layer.

11. The capacitive touch panel of claim 7 further comprising a third linking pad disposed outside of the second electrode layer, wherein the second A electrode string couples with the second B electrode string via a conducting wire disposed outside of the second electrode layer and the conducting wire couples with the third linking pad.

12. The capacitive touch panel of claim 1, wherein the first A electrode string and the first B electrode string are collinear in the first electrode layer.

13. The capacitive touch panel of claim 12 comprising a plurality of first A electrode strings and first B electrode strings disposed in parallel, wherein the first B electrode strings corresponding to the adjacent first A electrode strings are not adjacent to each other.

14. The capacitive touch panel of claim 12, wherein the second electrode layer has a second A electrode string and a second B electrode string distributed along the second direction, the second A electrode string and the second B electrode string have a plurality of second direction electrodes respectively, wherein the second A electrode string and the second B electrode string are disconnected in the second electrode layer, the second A electrode string and the second B electrode string are simultaneously detected for presence of signal variation.

15. The capacitive touch panel of claim 14, wherein the second A electrode string and the second B electrode string are disposed in parallel in the first electrode layer.

16. The capacitive touch panel of claim 15 comprising a plurality of the second A electrode strings and the second B electrode strings disposed in parallel, wherein the second B electrode strings corresponding to the adjacent second A electrode strings are not adjacent to each other.

17. A method of manufacturing a capacitive touch panels comprising:
    forming a first electrode layer having a first A electrode string and a first B electrode string distributed along a first direction, the first A electrode string and the first B electrode string respectively having a plurality of first direction electrodes, wherein one first direction electrode of the first A electrode string and one first direction electrode of the first B electrode string distributed in a straight line along the first direction are disconnected in the first electrode layer;
    forming a second electrode layer to overlap the first electrode layer and to have a plurality of second direction electrodes connected in series and distributed along a second direction, wherein the second direction crosses the first direction; and
    detecting for presence of signal variation in the first A electrode string and the first B electrode string.

18. The manufacture method of claim 17, wherein the step of forming the first electrode layer includes disposing the first A electrode string and the first B electrode string on the same row along the first direction.

19. The manufacture method of claim 18, wherein the step of forming the first electrode layer includes:
    forming a plurality of parallel first A electrode strings and a plurality of corresponding first B electrode strings; and
    disposing different number of the first direction electrodes on the adjacent first A electrode strings, wherein the space between the first A electrode strings and the first B electrode strings has a distribution shape selected from a group of an indented shape, an oblique shape and a trapezium.

20. The manufacture method of claim 18 further comprising:
    forming a first linking pad and a second linking pad outside of the first electrode layer;
    extending a conducting wire from a first end of the first electrode layer to couple the first A electrode string with the first linking pad; and
    extending a conducting wire from a second end of the first electrode layer to couple the first B electrode string with the second linking pad.

21. The manufacture method of claim 18 further comprising:
    forming a first linking pad outside of the first electrode layer;
    coupling the first A electrode string with the first B electrode string via a conducting wire outside of the first electrode layer; and
    coupling the conducting wire with the first linking pad.

22. The manufacture method of claim 18, wherein the step of forming the second electrode layer includes:
    connecting a part of the adjacent second direction electrodes in series to form a second A electrode string;
    connecting another part of the adjacent second direction electrodes to form a second B electrode strings, wherein the second A electrode string and the second B electrode string are disconnected in the second electrode layer; and
    detecting for presence of signal variation at the second A electrode string and the second B electrode string simultaneously.

23. The manufacture method of claim 22, wherein the step of forming the second electrode layer includes:
    forming a plurality of parallel second A electrode strings and a plurality of corresponding second B electrode strings; and
    disposing different number of the second direction electrodes on the adjacent second A electrode strings, wherein the space between the second A electrode strings and the second B electrode strings has a distribution shape selected from a group of an indented shape, an oblique line shape and a trapezium shape.

24. The manufacture method of claim 22 further comprising:
    disposing a third linking pad and a fourth linking pad outside of the second electrode layer;
    extending a conducting wire from a first end of the second electrode layer to couple the second A electrode string with the third linking pad; and
    extending a conducting wire from a second end of the second electrode layer to couple the second B electrode string with the fourth linking pad.

25. The manufacture method of claim 22 further comprising:
    forming a third linking pad outside of the second electrode layer;
    coupling the second A electrode string with the second B electrode string via a conducting wire disposed outside of the second electrode layer; and
    coupling the conducting wire with the third linking pad.

26. The manufacture method of claim 17, wherein the step of forming the first electrode layer includes disposing the first A electrode string and the first B electrode in parallel.

27. The manufacture method of claim 26, wherein the step of forming the first electrode layer includes:
    disposing the first A electrode strings and the B electrode strings in parallel; and
    positioning the first B electrode strings corresponding to the adjacent first A electrode strings to be not adjacent to each other.

28. The manufacture method of claim 27 further comprising outputting a determination signal from a plurality of the first A electrode strings when a signal variation is detected at the adjacent first A electrode strings.

29. The manufacture method of claim 26, wherein the step of forming the second electrode layer includes:
    disposing a second A electrode string and a second B electrode string along the second direction and thus the second A electrode string and the second B electrode string having a plurality of the second direction electrodes respectively, wherein the second A electrode string and the second B electrode string are disconnected in the second electrode layer; and
    detecting for presence of signal variation in the second A electrode string and the second B electrode string simultaneously.

30. The manufacture method of claim 29, wherein the step of forming the first electrode layer includes:
    disposing a plurality of the second A electrode strings and the second B electrode strings in parallel; and
    positioning the second B electrode strings corresponding to the adjacent second A electrode strings to be not adjacent to each other.

* * * * *